(12) United States Patent
Manning et al.

(10) Patent No.: US 12,183,387 B2
(45) Date of Patent: *Dec. 31, 2024

(54) LOGICAL OPERATIONS USING MEMORY CELLS

(71) Applicant: Lodestar Licensing Group LLC, Evanston, IL (US)

(72) Inventors: Troy A. Manning, Meridian, ID (US); Glen E. Hush, Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/859,992

(22) Filed: Jul. 7, 2022

(65) Prior Publication Data

US 2022/0343969 A1 Oct. 27, 2022

Related U.S. Application Data

(60) Continuation of application No. 16/840,874, filed on Apr. 6, 2020, now Pat. No. 11,404,109, which is a
(Continued)

(51) Int. Cl.
*G11C 11/4091* (2006.01)
*G11C 7/10* (2006.01)
(Continued)

(52) U.S. Cl.
CPC ........ *G11C 11/4091* (2013.01); *G11C 7/1006* (2013.01); *G11C 11/4097* (2013.01);
(Continued)

(58) Field of Classification Search
CPC ............ G11C 11/4091; G11C 11/4097; G11C 11/405; G11C 7/1006
(Continued)

(56) References Cited

U.S. PATENT DOCUMENTS

| 4,380,046 A | 4/1983 | Fung |
| 4,435,792 A | 3/1984 | Bechtolsheim |

(Continued)

FOREIGN PATENT DOCUMENTS

| CN | 102141905 | 8/2011 |
| CN | 107767907 | 3/2018 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Sung Il Cho

(57) ABSTRACT

The present disclosure includes apparatuses and methods related to logical operations using memory cells. An example apparatus comprises a first memory cell controlled to invert a data value stored therein and a second memory cell controlled to invert a data value stored therein. The apparatus may further include a controller coupled to the first memory cell and the second memory cell. The controller may be configured to cause performance of a logical operation between the data value stored in the first memory cell and the data value stored in the second memory cell.

19 Claims, 7 Drawing Sheets

Related U.S. Application Data division of application No. 15/884,179, filed on Jan. 30, 2018, now Pat. No. 10,614,875.

(51) Int. Cl.

| | | |
|---|---|---|
| *G11C 11/4097* | (2006.01) | |
| *H03K 19/0948* | (2006.01) | |
| *H03K 19/20* | (2006.01) | |
| *G11C 8/16* | (2006.01) | |
| *G11C 11/405* | (2006.01) | |

(52) U.S. Cl.
CPC ......... *H03K 19/0948* (2013.01); *H03K 19/20* (2013.01); *G11C 8/16* (2013.01); *G11C 11/405* (2013.01)

(58) Field of Classification Search
USPC ....................................................... 365/149
See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,289,475 A | 2/1994 | Slemmer |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,496,756 A | 3/1996 | Sharma et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,646,903 A | 7/1997 | Johnson |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,818,784 A | 10/1998 | Muranaka et al. |
| 5,854,636 A | 12/1998 | Watanabe et al. |
| 5,867,429 A | 2/1999 | Chen et al. |
| 5,870,504 A | 2/1999 | Nemoto et al. |
| 5,909,400 A | 6/1999 | Bertin et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,661,701 B2 | 12/2003 | Dahl et al. |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,809,979 B1 | 10/2004 | Tang |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |

(56) References Cited

U.S. PATENT DOCUMENTS

| | | |
|---|---|---|
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,379,433 B2 | 2/2013 | Houston et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,672,895 B2 | 6/2017 | Antonyan |
| 9,697,876 B1 | 7/2017 | Tiwari et al. |
| 10,008,502 B2 | 6/2018 | Endo |
| 10,388,364 B2 | 8/2019 | Ishizu et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0051397 A1* | 5/2002 | Watanabe ............ G11C 7/1072 365/222 |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0029551 A1 | 2/2005 | Atwood |
| 2005/0078514 A1 | 4/2005 | Scheuerlein et al. |
| 2005/0097417 A1 | 5/2005 | Agrawal et al. |
| 2005/0152199 A1 | 7/2005 | Park |
| 2005/0169040 A1 | 8/2005 | Peng et al. |
| 2005/0226079 A1 | 10/2005 | Zhu et al. |
| 2005/0237786 A1 | 10/2005 | Atwood et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0081380 A1 | 4/2007 | Atwood et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuj |
| 2008/0025073 A1 | 1/2008 | Arsovski |
| 2008/0037333 A1 | 2/2008 | Kim et al. |
| 2008/0043540 A1 | 2/2008 | Boemler |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0141537 A1 | 12/2009 | Arsovski |
| 2010/0054022 A1 | 3/2010 | Beck et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0302837 A1 | 12/2010 | Zhang et al. |
| 2010/0308858 A1 | 12/2010 | Noda et al. |
| 2010/0332895 A1 | 12/2010 | Billing et al. |
| 2011/0013442 A1 | 1/2011 | Akerib et al. |
| 2011/0026323 A1 | 2/2011 | Luk et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1* | 6/2012 | Agam ................ G11C 15/043 365/49.1 |
| 2012/0170348 A1* | 7/2012 | Clinton ............. G11C 11/2275 365/145 |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Heir |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0308364 A1 | 11/2013 | Smith |
| 2013/0326154 A1 | 12/2013 | Haswell |
| 2013/0332707 A1 | 12/2013 | Gueron et al. |
| 2014/0119099 A1* | 5/2014 | Clark .................. H10B 12/50 365/149 |
| 2014/0133251 A1* | 5/2014 | Takahashi ............. G11C 7/08 365/189.16 |

(56) References Cited

U.S. PATENT DOCUMENTS

| | | |
|---|---|---|
| 2014/0185395 A1 | 7/2014 | Seo |
| 2014/0215185 A1 | 7/2014 | Danielsen |
| 2014/0250279 A1* | 9/2014 | Manning .............. G06F 12/00 711/154 |
| 2014/0344934 A1 | 11/2014 | Jorgensen |
| 2014/0362649 A1 | 12/2014 | Hsiao |
| 2014/0374747 A1 | 12/2014 | Kurokawa |
| 2015/0016197 A1 | 1/2015 | Hsiao |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1* | 9/2016 | Tiwari ................ G11C 11/4096 |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0350230 A1 | 12/2016 | Murphy |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Ea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0323674 A1 | 11/2017 | Kang |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0371539 A1 | 12/2017 | Mai et al. |
| 2018/0012636 A1 | 1/2018 | Alzheimer et al. |
| 2018/0024769 A1 | 1/2018 | Howe et al. |
| 2018/0024926 A1 | 1/2018 | Penney et al. |
| 2018/0025757 A1 | 1/2018 | Chan et al. |
| 2018/0025759 A1 | 1/2018 | Penney et al. |
| 2018/0025768 A1 | 1/2018 | Hush |
| 2018/0075892 A1 | 3/2018 | Nakatsuka et al. |
| 2018/0122456 A1* | 5/2018 | Li ........................ G11C 7/1006 |
| 2018/0144779 A1 | 5/2018 | Willcock et al. |

FOREIGN PATENT DOCUMENTS

| | | |
|---|---|---|
| EP | 0214718 | 3/1987 |
| EP | 2026209 | 2/2009 |
| JP | H0831168 | 2/1996 |
| JP | H1117025 | 1/1999 |
| JP | 2009259193 | 3/2015 |
| KR | 10-0211482 | 8/1998 |
| KR | 10-2010-0134235 | 12/2010 |
| KR | 10-2013-0049421 | 5/2013 |
| KR | 20150071732 | 6/2015 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, mailed Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

(56) References Cited

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7. Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

International Search Report and Written Opinion for related PCT Application No. PCT/US2019/013765, dated May 1, 2019, 16 pages.

Search Report from related European U.S. Appl. No. 19/747,682, dated Aug. 26,. 2021, 10 pages.

\* cited by examiner

LOGICAL OPERATIONS USING MEMORY CELLS

PRIORITY INFORMATION

This application is a Continuation of U.S. application Ser. No. 16/840,874, filed Apr. 6, 2020, which is a Divisional of U.S. application Ser. No. 15/884,179, filed Jan. 30, 2018, which issued as U.S. Pat. No. 10,614,875 on Apr. 7, 2020, the contents of which are included herein by reference.

TECHNICAL FIELD

The present disclosure relates generally to semiconductor memory and methods, and more particularly, to apparatuses and methods related to logical operations using memory cells.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as PIM devices, can affect processing time and/or power consumption.

DETAILED DESCRIPTION

Figure 1:
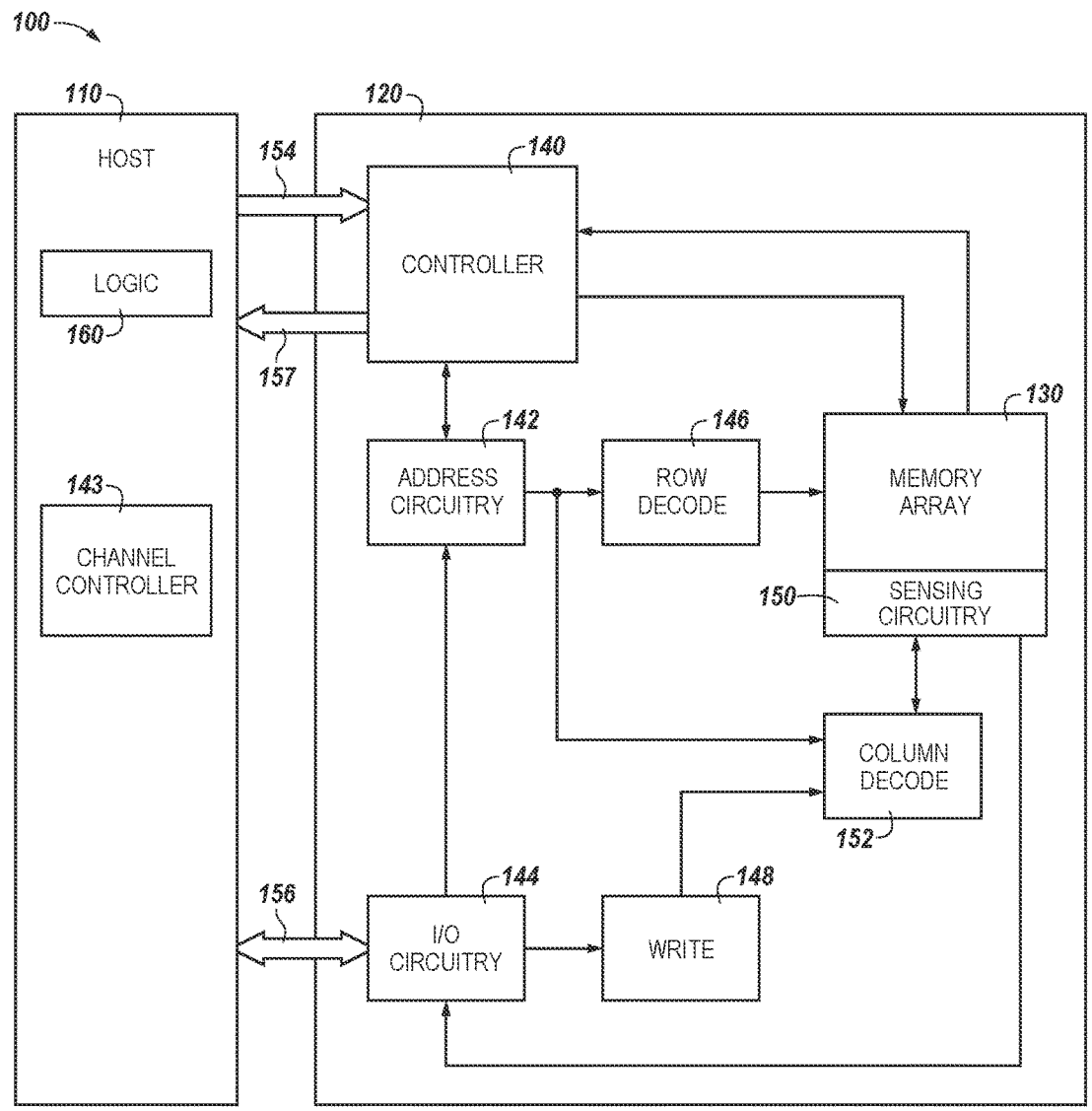
FIG. 1 is a block diagram of an apparatus in the form of a computing system including a memory device in accordance with a number of embodiments of the present disclosure.

The present disclosure includes apparatuses and methods related to logical operations using memory cells. An example apparatus comprises a first memory cell controlled to invert a data value stored therein and a second memory cell controlled to invert a data value stored therein. The apparatus may further include a controller coupled to the first memory cell and the second memory cell. The controller may be configured to cause performance of a logical operation between the data value stored in the first memory cell and the data value stored in the second memory cell.

Dynamic random access memory (DRAM) may be provided as part of a computing system to store data associated with the computing system. In some approaches, DRAM may comprise multiple one transistor, one capacitor (1T1C) memory cells, which may be coupled together to form a memory array. In 1T1C DRAM environments, binary data information may be stored in the capacitor in the form of an electric charge. Once a 1T1C memory cell has been read (e.g., once a read operation has been performed using data stored in the 1T1C memory cell), the electric charge corresponding to the binary data information stored in the capacitor may discharge (e.g., leak, become depleted, etc.) thereby destroying the binary data information that was stored in the capacitor. This phenomenon may be referred to as a "destructive read" or "destructive memory cell read."

In contrast, DRAM memory cells having three transistors (3T) may preserve the binary data information (e.g., may preserve the charge stored therein) subsequent to performance of a read operation. This may allow for multiple word lines (e.g., read row lines, write row lines, etc.) to be fired without the need to refresh the memory cells or re-write data to the memory cells subsequent to performance of a read operation. This may reduce power consumption of a memory device since the memory cells do not need to be re-written or refreshed in comparison to conventional 1T1C DRAM memory cells, and may reduce an amount of time (e.g., a read-to-read delay) required between performance of read operations in comparison to conventional 1T1C DRAM memory cells.

In some approaches, performing logical operations between binary data (e.g., operands) stored in memory cells and binary data stored in an accumulator may require multiple latches per column because binary data may need to be inverted (e.g., using a latch in addition to a sense amplifier latch) prior to performance of a logical operation. For example, in some approaches, data would be transferred to a first latch to be inverted, and the inverted data stored in the first latch may have been used as an operand in a logical operation between the inverted operands and operands stored in an accumulator. In contrast, embodiments disclosed herein allow for logical operations to be performed between binary data (e.g., operands) stored in the memory cells without using an additional latch to perform the inversion. For example, a 3T memory cell may be controlled to invert the data stored therein without the need for an additional latch. In some embodiments, the inverted data associated with the 3T memory cell may then be used as an operand for a logical operation.

In some embodiments, when the word lines (e.g., read row lines, write row lines, etc.) coupled to a memory cell are enabled, the read digit lines of the memory device may be driven low thereby creating a NOR read. The number of word lines enabled corresponds to the number of inputs of a NOR gate created by enabling the word lines.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n, "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 306 may reference element "06" in FIG. 3, and a similar element may be referenced as 406 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array (e.g., a 3T DRAM array), SRAM array, STT RAM array, PCRAM array, TRAM array, RRAM array, NAND flash array, and/or NOR flash array, for instance. The array 130 can comprise memory cells arranged in rows coupled by word lines, which may be referred to herein as access lines or select lines, and columns coupled by digit lines, which may be referred to herein as data lines or sense lines. Although a single array 130 is shown in FIG. 1, embodiments are not so limited. For instance, memory device 120 may include a number of arrays 130 (e.g., a number of banks of DRAM cells, NAND flash cells, etc.). In some embodiments, the memory array may include the sense amplifier 150 in addition to the memory cells arranged in rows coupled by word lines and columns coupled by digit lines.

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC), field programmable gate array, etc. The controller 140 can control, for example, performance of logical operations between operands stored in the memory array 130.

As described further below, in a number of embodiments, the sensing circuitry 150 and/or the array 130 can comprise a sense amplifier. The sense amplifier may also be referred to herein as an accumulator, and can be used in the performance of logical operations.

In a number of embodiments, the sensing circuitry 150 can be used to perform logical operations using data stored in array 130 as inputs and/or store the results of the logical operations back to the array 130 without transferring data via a digit line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array.

In a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

Figure 2A:
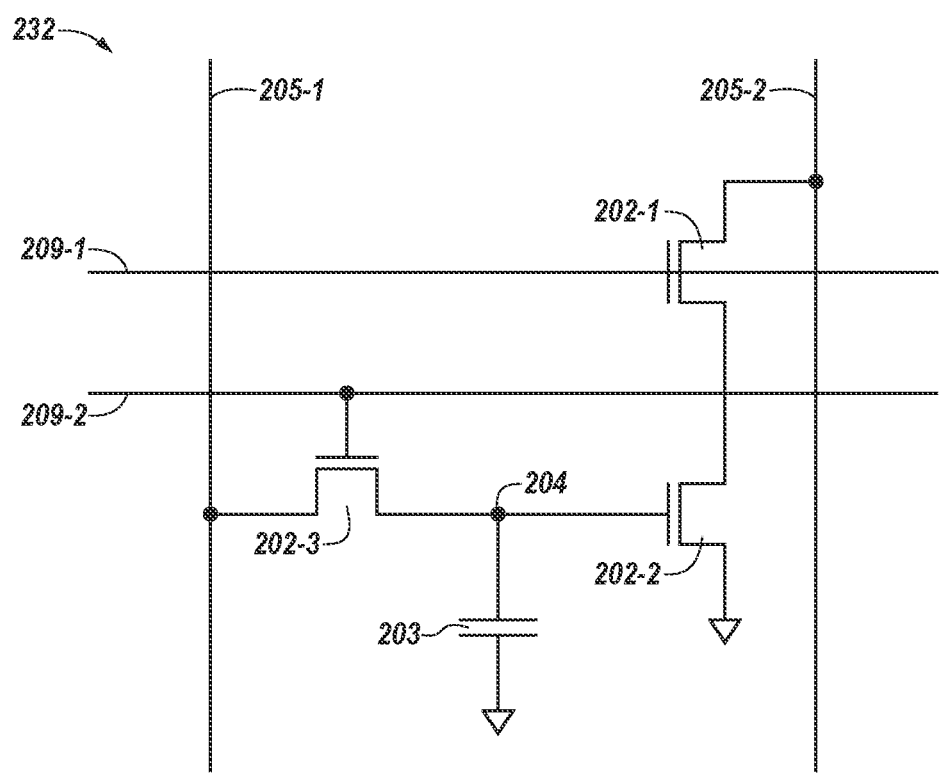
FIG. 2A is a schematic drawing illustrating a portion of a memory array in accordance with a number of embodiments of the present disclosure.

FIG. 2A is a schematic drawing illustrating a portion of a memory array in accordance with a number of embodiments of the present disclosure. FIG. 2A illustrates one memory cell 232, which can be one of a number of memory cells corresponding to memory array 130 shown in FIG. 1. In the example shown in FIG. 2, the memory cell 232 is a 3T DRAM memory cell. In this example, the memory cell 232 comprises three transistors 202-1, 202-2, and 202-3. The memory cell 232 may be operated to store a data value (e.g., stored charge at node 204). In some embodiments, a charge associated with the data value may be stored at node 204 using the parasitic capacitance generated between transistor 202-3 and transistor 203-2. Embodiments are not so limited; however, and the memory cell 232 may optionally include a discrete capacitor 203 to store the data value.

The memory cell 232 includes two word lines 209-1/209-2 (e.g., row lines) and two digit lines 205-1/205-2 (e.g., bit lines). Word line 209-1 may be referred to herein as a read row line, and the word line 209-2 may be referred to herein as a write row line. Digit line 205-1 may be referred to herein as a write digit line, and digit line 205-2 may be referred to herein as a read digit line. The word lines 209-1/209-2 and the digit lines 205-1/205-2 may be enabled and/or disabled in conjunction with reading and writing data to the node 204 of the memory cell 232.

As shown in FIG. 2A, the transistors 203-2, 203-2, and 203-3 are coupled to the word lines 209-1/209-2 and digit lines 205-1/205-2. In association with performing a write operation, the write row line 209-2 may be enabled, and data may be placed on the write digit line 205-1, thereby causing the data to be stored at node 204. Similarly, in association with performing a read operation, the read row line 209-1 may be enabled and the data may be transferred out of the node 204 via the read digit line 205-2. In some embodiments, the data value read out of the memory cell 232 as part of a read operation may be inverted in comparison to the data value written to the memory cell 232 as part of the write operation. For example, if a value of "1" is written to the memory cell 232, a value of "0" may be read out of the memory cell 232. Conversely, if a value of "0" is written to the memory cell 232, a value of "1" may be read out of the memory cell 232.

For example, memory cell 232 can be coupled to different digit lines 205-1/205-2 and word lines 209-1/209-2. For instance, in this example, a first source/drain region of transistor 202-3 is coupled to digit line 205-1, a second source/drain region of transistor 202-3 is coupled to node 204, and a gate of transistor 202-3 is coupled to word line 209-2. A first source/drain region of transistor 202-1 is coupled to digit line 205-2, a second source/drain region of transistor 202-1 is coupled to a first source/drain region of transistor 202-2, and a gate of transistor 202-1 is coupled to word line 209-1.

In some embodiments, the data value stored at node 204 of the memory cell 232 may be used as an operand for performance of a logical operation. For example, a data value stored at node 204 of the memory cell 232 may be used as an operand to perform a logical operation with a data value stored at node 204 of a different memory cell, as described in more detail in association with FIGS. 3-5. In some embodiments, the logical operation may comprise a NOR operation; however, embodiments are not so limited, and various logical operations such as ANDs, ORs, XORs, NANDs etc. operations may be performed by performing multiple combinations of NOR operations in the manner described herein.

In some embodiments, the memory cell 232 may be controlled to store a data value at node 204 subsequent to performance of a read operation. For example, the memory cell 232 may be controlled such that read operations are non-destructive. This may allow for multiple rows (e.g., read rows) to be fired without refreshing or re-writing data to the memory cell 232, which may allow for improved performance and reduced power consumption in comparison with previous approaches that utilize destructive read cells such as 1T1C memory cells.

Although schematically represented in a planar orientation, the transistors 202-1, 202-2, and/or 202-3 may be arranged in a vertical orientation (e.g., extending upward out of the page or downward into the page in FIG. 2). In some embodiments, the transistors 202-1, 202-2, and/or 202-3 of the memory cell 232 may be formed such that the transistors 202-1, 202-2, and/or 202-3 are contained within an area defined by the digit lines 205-1/205-2. For example, the transistors 202-1, 202-2, and/or 202-3 of the memory cell 232 may be formed on pitch with digit lines 205-1/205-2 of the memory cell 232. In some embodiments, the memory cell 232 may be formed such that the transistors 202-1, 202-2, and/or 202-3 of the memory cell 232 are disposed within an area that equal to or less than an area used by a conventional 1T1C DRAM memory cell.

Figure 2B:
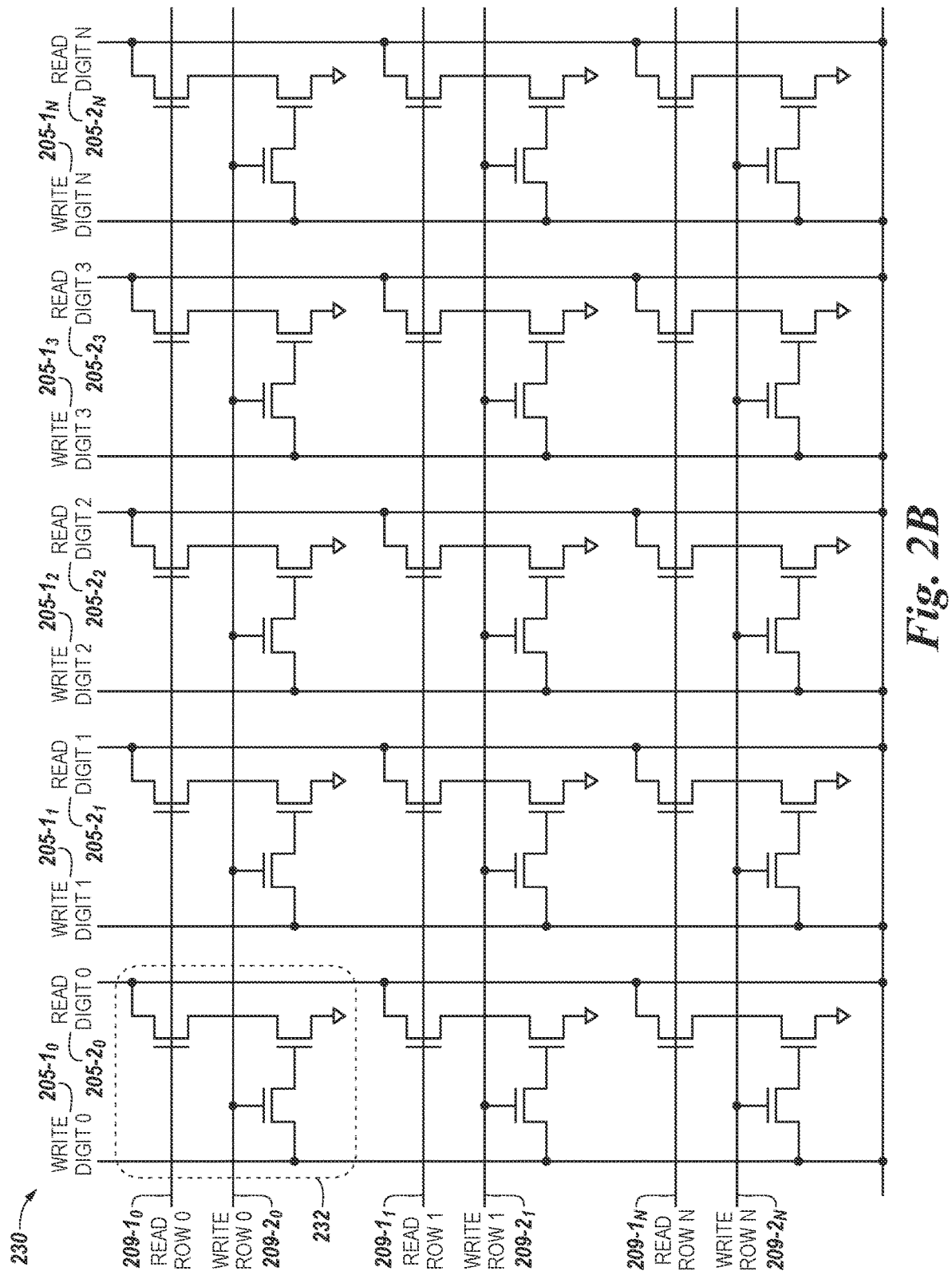
FIG. 2B is another schematic drawing illustrating a portion of a memory array in accordance with a number of embodiments of the present disclosure.

FIG. 2B is another schematic drawing illustrating a portion of a memory array 230 in accordance with a number of embodiments of the present disclosure. As shown in FIG. 2B, the memory array 230 comprises a plurality of memory cells 232. For clarity, only one memory cell 232 is labeled in FIG. 2B; however, each set of three transistors illustrated in FIG. 2B represents one of a plurality of memory cells 232 associated with the memory array 230.

A plurality of memory cells 232 are coupled to a plurality of digit lines 205 and row lines 209. For example, a first memory cell 232 is coupled to digit lines $205\text{-}1_0/205\text{-}2_0$ (e.g., write digit0 line $205\text{-}1_0$ and read digit0 line $205\text{-}2_0$) and row lines $209\text{-}1_0/209\text{-}2_0$ (e.g., read row0 line $209\text{-}1_0$ and write row0 line $209\text{-}2_0$). Similarly, a second memory cell is coupled to digit lines $205\text{-}1_1/205\text{-}2_1$ (e.g., write digit1 line $205\text{-}1_1$ and read digit1 line $205\text{-}2_1$) and word lines $209\text{-}1_0/209\text{-}2_0$ (e.g., read row0 line $209\text{-}1_0$ and write row0 line $209\text{-}2_0$), a third memory cell is coupled to digit lines $205\text{-}1_0/205\text{-}2_0$ (e.g., write digit0 line $205\text{-}1_0$ and read digit0 line $205\text{-}2_0$) and word lines $209\text{-}1_1/209\text{-}2_1$ (e.g., read row1 line $209\text{-}1_1$ and write row1 line $209\text{-}2_1$), etc.

In operation, the memory array 230 may be controlled to perform a logical operation using data values (e.g., operands) stored in the memory cells. In some embodiments, performance of such logical operations can include precharging at least one of the digit lines $205\text{-}2_0, \ldots, 205\text{-}2_N$. Once the at least one digit line is precharged (e.g., to a supply voltage such as $V_{cc}$), one or more word lines $209\text{-}1_0, \ldots, 209\text{-}1_N$ and/or $209\text{-}2_0, \ldots, 209\text{-}2_N$ may be enabled. Each word line $209\text{-}1_0, \ldots, 209\text{-}1_N$ and/or $209\text{-}2_0, \ldots, 209\text{-}2_N$ that is enabled may correspond to an input of a K-input NOR operation where K is the quantity of word lines enabled. For example, if only two word lines (e.g., word line $209\text{-}1_0$ and word line $209\text{-}1_1$) are enabled, a 2-input NOR gate results, if three word lines (e.g., word line $209\text{-}1_0$, word line $209\text{-}1_1$, and word line $209\text{-}1_2$) are enabled, a 3-input NOR operation results, etc. Further, each digit line $205\text{-}2_0, \ldots, 205\text{-}2_N$ that is enabled may correspond to an additional K-input NOR gate. Accordingly, each digit line $205\text{-}2_0, \ldots, 205\text{-}2_N$ that is enabled may correspond to N NOR gates that each comprise K-inputs where N is the number of enabled digit line $205\text{-}2_0, \ldots, 205\text{-}2_N$. As an example, if three word lines (e.g., word lines $209\text{-}1_0, \ldots, 209\text{-}1_3$ and/or word lines $209\text{-}2_0, \ldots, 209\text{-}2_3$) are enabled and each word line enables 1024 digit lines (e.g., when K=3 and N=1024), then 1024 3-input NOR gates result. That is, in some embodiments, enabling combinations of K word lines and N digit lines yields N NOR gates each having K inputs associated therewith.

In some embodiments, if one or more memory cells 232 coupled to a particular digit line $205\text{-}2_0, \ldots, 205\text{-}2_N$ (e.g., if one or more memory cells in a particular column of memory cells) contains a high voltage (e.g., a logical value of "1"), the associated digit line $205\text{-}2_0, \ldots, 205\text{-}2_N$ will be driven to a ground reference potential. For example, if memory cell 232 (or any other memory cell in the column of memory cells coupled to digit line $205\text{-}2_0$) contains a high voltage, digit line $205\text{-}2_0$ will be driven to a ground reference potential.

Figure 3:
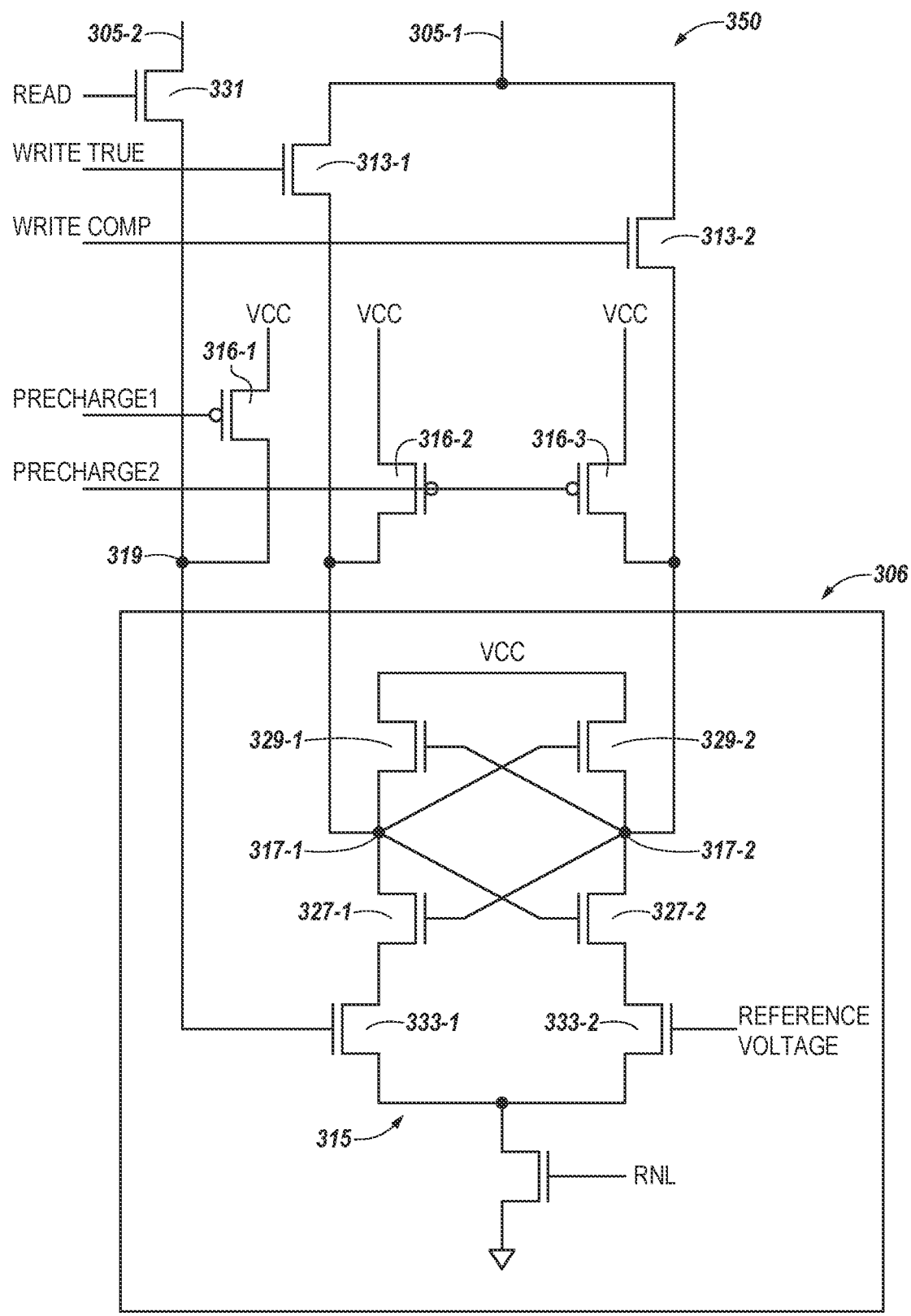
FIG. 3 is a schematic diagram illustrating sensing circuitry in accordance with a number of embodiments of the present disclosure.

As described in more detail in association with FIG. 3, herein, a sense amplifier (e.g., sense amplifier 306 illustrated in FIG. 3) is coupled to respective pairs of digit lines $205\text{-}1_0, \ldots, 205\text{-}1_N$ and $205\text{-}2_0, \ldots, 205\text{-}2_N$. The sense amplifier may sense a low voltage (e.g., a logical value of "0") if one or more of the memory cells coupled to a same pair of digit lines $205\text{-}1_0, \ldots, 205\text{-}1_N$ and $205\text{-}2_0, \ldots, 205\text{-}2_N$ that are also coupled to the sense amplifier contains a high voltage (e.g., a logical value of "1"). Conversely, the sense amplifier may sense a high voltage (e.g., a logical value of "1") if one or more of the memory cells coupled to a same pair of digit lines $205\text{-}1_0, \ldots, 205\text{-}1_N$ and $205\text{-}2_0, \ldots, 205\text{-}2_N$ that are also coupled to the sense amplifier contains a low voltage (e.g., a logical value of "0"). That is, in some embodiments, the sense amplifier may sense a particular value (e.g., a "1" or a "0") based on the value stored in the memory cell that is coupled thereto.

As mentioned above, because a read operation using the memory cell 232 described in FIGS. 2A and 2B may be non-destructive, the memory cell 232 may still contain the original data value (e.g., the same high or low voltage) that was stored therein prior to performance of the read operation and/or performance of the logical operation, while the sense amplifier may contain a result of the logical operation after performance of the logical operation. In some embodiments, the data value (e.g., the logical value of "0" or "1") stored in the sense amplifier subsequent to performance of the logical operation may be written back to any memory cell 232 (or row of memory cells) in the memory array 230, as described in more detail in association with FIG. 3, herein.

FIG. 3 is a schematic diagram illustrating sensing circuitry 350 in accordance with a number of embodiments of the present disclosure. FIG. 3 illustrates one sensing component 350 which can be one of a number of sensing components corresponding to sensing circuitry 150 shown in FIG. 1. The sensing component 350 may be coupled to a memory cell, such as memory cell 232 shown in FIG. 2 via the digit line 305-2 (e.g., read digit line 305-2) and the digit line 305-1 (e.g., write digit line 305-1). In some embodiments, the sensing component 350 includes a sense amplifier 306. As shown in FIG. 3, the sense amplifier 306 is a current mode sense amplifier; however embodiments are not so limited and the sense amplifier 306 may be any suitable type of differential or non-differential sense amplifier.

The sense amplifier 306 can be operated to determine a data value (e.g., logic state) stored in a selected memory cell. The sense amplifier 306 can comprise a cross coupled latch 315 (e.g., gates of a pair of transistors, such as n-channel transistors 327-1 and 327-2 that are cross coupled with the gates of another pair of transistors, such as p-channel transistors 329-1 and 329-2); however, embodiments are not limited to this example. The sense amplifier 306 may further include a transistor 333-1, which is coupled to the digit line 305-2, and transistor 333-2, which is coupled to a reference potential (e.g., a reference voltage).

In some embodiments, a source/drain region of a transistor 331 is coupled to the digit line 305-2 and a gate region of the transistor 331 is coupled to a Read enable signal line. In operation, when a memory cell (e.g., memory cell 232 illustrated in FIG. 2) is being sensed (e.g., read), the transistor 331 is operable to allow signals to pass between a memory cell coupled to the digit line 305-2 and the sense amplifier 306 when the Read enable signal line is driven high. In some embodiments, the transistor 331 may be operable to gate signals on the digit line 305-2 when the Read enable signal line is driven low.

The cross-coupled latch 315 includes a plurality of transistors 327-1, 327-2, 329-1, and 329-2. The gates of transistors 327-2 and 329-2 are coupled to common node 317-1, while the source/drain region of transistors 327-2 and 329-2 are coupled to common node 317-2. In a complementary fashion, the gates of transistors 327-1 and 329-1 are coupled to common node 317-2, while the source/drain region of transistors 327-1 and 329-1 are coupled to common node 317-1. In some embodiments, the sense amplifier 306 may be operated to amplify a differential voltage between common node 317-1 and common node 317-2 such that the common node 317-1 is driven to one of $V_{cc}$ and a ground reference potential.

Embodiments are not limited to the sensing component configuration illustrated in FIG. 3. As an example, the sense amplifier 306 can be a single-ended sense amplifier (e.g., sense amplifier coupled to one digit line), or other suitable sense amplifier. Also, embodiments of the present disclosure are not limited to a single-ended sense amplifier architecture such as that shown in FIG. 3.

Memory cells (e.g., memory cell 232 illustrated in FIG. 2) can be arranged in rows coupled by word lines (e.g., row lines 209-1 and 209-2 illustrated in FIGS. 2A and 2B), etc., and columns coupled by digit lines 305-1 and 305-2. Although only two digit lines 305-1/305-2 are shown in FIG. 3, embodiments of the present disclosure are not so limited, and an array of memory cells can include additional columns of memory cells and digit lines (e.g., 4,096, 8,192, 16,384, etc.).

The digit lines 305-1 and 305-2 of memory array (e.g., memory array 130 shown in FIG. 1) are coupled to sensing component 350 in accordance with a number of embodiments of the present disclosure. In this example, the sensing component 350 comprises a sense amplifier 306 corresponding to a respective column of memory cells (e.g., coupled to respective digit lines 305-1/305-2). For example, the sense amplifier 306 is coupled to the digit lines 305-1 and 305-2, which may also be coupled to a memory cell (e.g., memory cell 232 shown in FIG. 2A) or column of memory cells (as shown in FIG. 2B).

The digit line 305-1 is coupled to write transistor 313-1 and write complement transistor 313-2. A gate region of the write transistor 313-1 is coupled to a write true signal line ("Write true") and a gate region of the write complement transistor is coupled to a write complement signal line ("Write comp"). Source/drain regions of the write transistor 313-2 and the write complement transistor 313-2 are coupled to common nodes 317-1 and 317-2 of the sense amplifier, respectively. In some embodiments, the write transistor 313-1 is operable to transfer a data value stored in the sense amplifier 306 to the memory cell (e.g., memory cell 232 illustrated in FIG. 2) via the digit line 305-1, while in some embodiments the write complement transistor 313-2 is operable to transfer a complement of the data value stored in the sense amplifier 306 to the memory cell via the digit line 305-1. Providing the ability to write either the true or the complement of the data value stored in the sense amplifier 306 may facilitate performance of logical operations between operand stored in the memory cell(s) and/or performance of logical operations between operands stored in the memory cell and the sense amplifier 306 in accordance with a number of embodiments of the disclosure.

For example, when the write true signal line is driven high, the write transistor 313-1 is enabled such that a data value associated with common node 317-1 is transferred from the sense amplifier via the digit line 305-2. When the write complement signal line is driven high, the write complement transistor 313-2 is enabled such that a complement of the data value stored in the sense amp (e.g., a data value associated with common node 317-2) is transferred from the sense amplifier 306 via the digit line 305-1.

The digit line 305-1 may be coupled to a precharge line ("Precharge1"), which may be configured to drive the voltage at transistor 316-1 either low or high depending on whether the Precharge1 line is driven high or low. A pair of transistors 316-2/316-3 may be coupled to a precharge line ("Precharge2") line, which may be configured to drive the transistors 316-2/316-3 either high or low depending on whether the Precharge2 line is driven high or low.

As shown in FIG. 3, each of the precharge transistors 316-1, 316-2, 316-3 can have a source/drain region that is driven to $V_{cc}$ and a gate coupled to a respective one of the Precharge lines. For example, the gate of transistor 316-1 is coupled to the Precharge1 line and the gates of transistors 316-2 and 316-3 are coupled to the Precharge2 line. A drain/source region of transistor 316-1 is coupled to digit line 305-2 via sense amplifier input node 319, while respective source/drain regions of transistors 316-2 and 316-3 are coupled to digit line 305-1. As will be appreciated, a charge present on digit line 305-2 will be the same as a charge present at sense amplifier input node 319 during operation of the sensing component 350.

In operation, the sense amplifier 306 is configured to latch a data value (e.g., a data value read from a memory cell via digit line 305-1). In contrast to approaches that utilize a 1T1C DRAM memory cell, in order to write the data value from the sense amplifier 306 to the memory cell (e.g., memory cell 232 illustrated in FIG. 2), the digit line 305-1 is enabled by, for example, operating the write true transistor 313-1 and/or the write complement transistor 313-2. In some embodiments, this is due to the non-destructive nature of read operations performed by the memory cell when the memory cell is a 3T memory cell.

Figure 4:
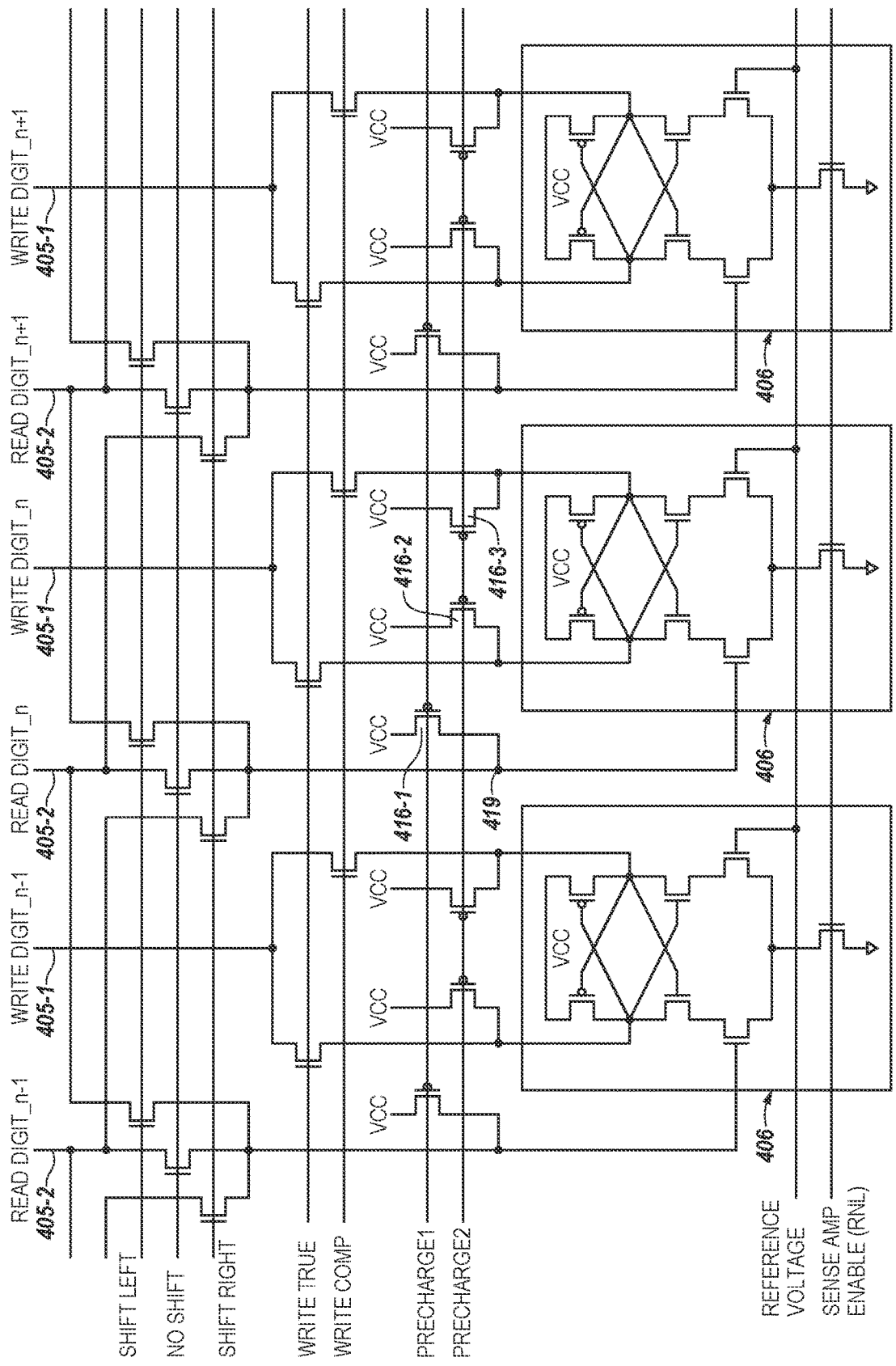
FIG. 4 is a schematic diagram illustrating sensing circuitry in accordance with a number of embodiments of the present disclosure.

FIG. 4 is a schematic diagram illustrating sensing circuitry in accordance with a number of embodiments of the present disclosure. FIG. 4 shows a number of sense amplifiers 406 coupled to respective digit lines 405-1 and 405-2. The sense amplifiers 406 shown in FIG. 4 can correspond to sensing circuitry 150 shown in FIG. 1 and/or sense amplifier 306 shown in FIG. 3, for example.

Although not shown, memory cells, such as those described in FIG. 2, are coupled to the respective digit lines 405-1 and 405-2 The cells of the memory array can be arranged in rows coupled by word lines and columns coupled by pairs of digit lines Read digit(n−1)/Write digit (n−1)_, Read digit(n)/Write digit(n)_, Read digit(n+1)/Write digit(n+1)_, etc. The individual digit lines corresponding to each pair of respective digit lines can also be referred to as data lines. Although only three pairs of digit lines (e.g., three columns) are shown in FIG. 4, embodiments of the present disclosure are not so limited.

A data value present on a digit line 405-2 can be loaded into the corresponding sense amplifier 406. In some embodiments, the data value may be shifted from a memory cell associated with a first column of the array to sense amplifier 406 associated with a second column of the array. For example, a data value present on the Read digit_n digit line 405-2 can be loaded into sense amplifier 406-3, which is in a column adjacent to the column associated with the Read digit_n digit line 405-2. In some embodiments, the data may be shifted in this manner by enabling shift right transistor 421-3. Similarly, a data value present on the Read digit_n digit line 405-2 can be loaded into sense amplifier 406-1, which is in a column adjacent to the column associated with the Read digit_n digit line 405-2 by enabling shift left transistor 421-1. As will be appreciated, when the no shift transistor 421-2 is enabled, a data value present on the Read digit_n digit line 405-2 may be read into sense amplifier 406-2.

Embodiments are not limited to shifting data that is being read into the sense amplifier 406, and the shift left transistor 421-1, the no shift transistor 421-2, and/or the shift right transistor 421-3 may be individually enabled to shift data being written out the sense amplifiers 406 via digit line 405-1 to memory cells coupled to columns adjacent to the sense amplifier 406 from which the data value is being written.

Although not shown in FIG. 4, each column may be coupled to memory cells (e.g., memory cell 232 shown in FIG. 2), which can be coupled to a column decode line that can be activated to transfer, via a local I/O line, data values from corresponding sense amplifiers 406 to a control component external to the array such as an external processing resource (e.g., host processor and/or other functional unit circuitry). The column decode line can be coupled to a column decoder. However, as described herein, in a number of embodiments, data need not be transferred via such I/O lines to perform shift operations in accordance with embodiments of the present disclosure. In a number of embodiments, shift circuitry (e.g., shift left transistor 421-1, the no shift transistor 421-2, and/or the shift left transistor 421-3) can be operated in conjunction with sense amplifiers 406 to perform shift operations without transferring data to a control component external to the array, for instance. As used herein, transferring data, which may also be referred to as moving data or shifting data is an inclusive term that can include, for example, copying data from a source location to a destination location and/or moving data from a source location to a destination location without necessarily maintaining a copy of the data at the source location (e.g., at the sense amplifier 406).

Figure 5:
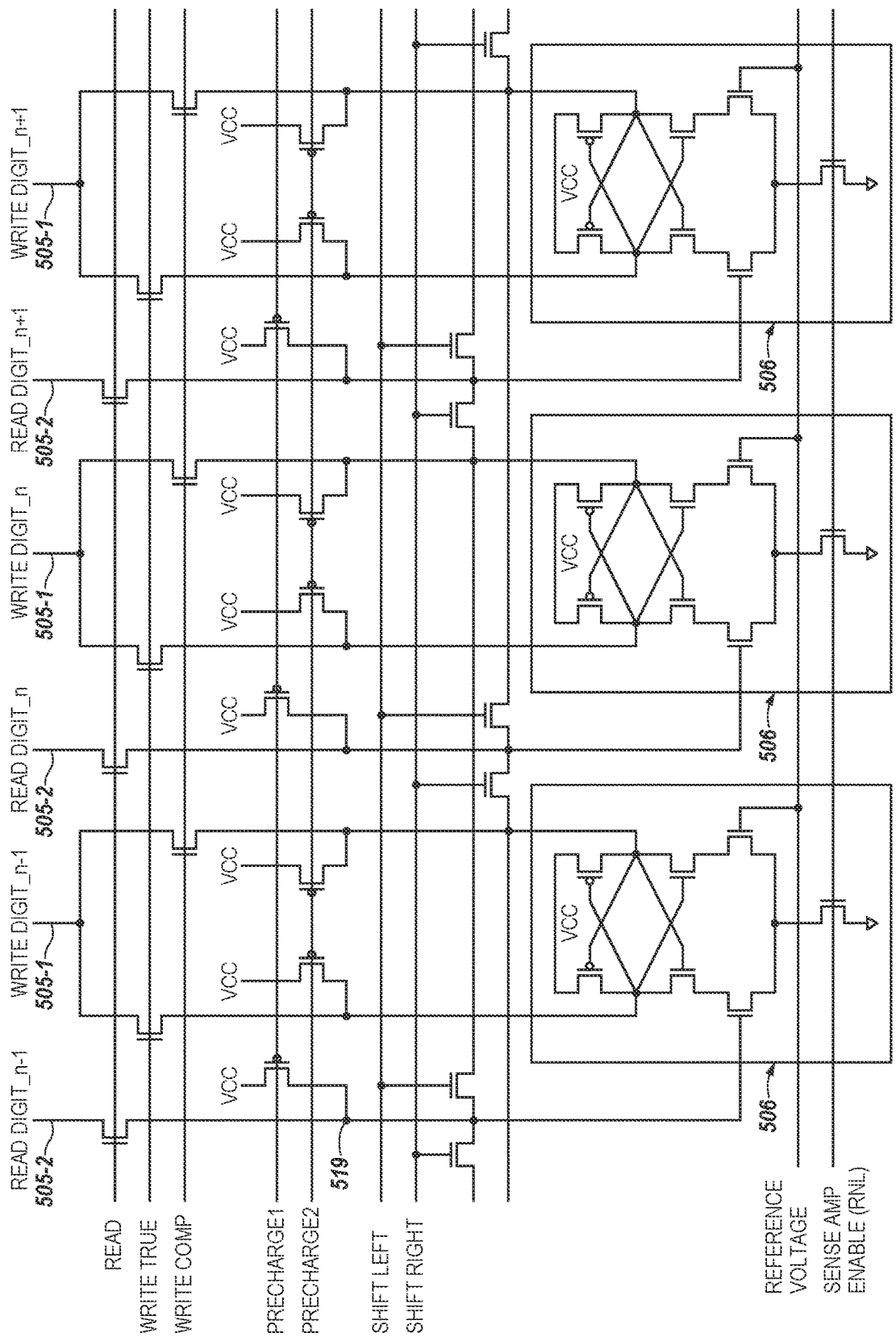
FIG. 5 is another schematic diagram illustrating sensing circuitry in accordance with a number of embodiments of the present disclosure.

FIG. 5 is another schematic diagram illustrating sensing circuitry in accordance with a number of embodiments of the present disclosure. FIG. 5 shows a number of sense amplifiers 506 coupled to respective digit lines 505-1 and 505-2. The sense amplifiers 506 shown in FIG. 5 can correspond to sensing circuitry 150 shown in FIG. 1 and/or sense amplifier 306 shown in FIG. 3, for example.

Although not shown, memory cells, such as those described in FIG. 2, are coupled to the respective digit lines 505-1 and 505-2 The cells of the memory array can be arranged in rows coupled by word lines and columns coupled by pairs of digit lines Read digit(n−1)/Write digit (n−1)_, Read digit(n)/Write digit(n)_, Read digit(n+1)/Write digit(n+1)_, etc. The individual digit lines corresponding to each pair of respective digit lines can also be referred to as data lines. Although only three pairs of digit lines (e.g., three columns) are shown in FIG. 5, embodiments of the present disclosure are not so limited.

A data value present on a digit line 505-1 can be loaded into the corresponding sense amplifier 506 via sense amplifier input node 519. In some embodiments, the data value may be shifted from a sense amplifier 506 associated with a first column of the array to sense amplifier 506 associated with a second column of the array. For example, a data value present on the Read digit_n digit line 505-2 can be loaded into the middle sense amplifier 506, which is in a column adjacent to the column associated with the Read digit_n−1 digit line 505-2 and the Read digit_n+1 digit line 506-2. The data value can then be shifted to the right sense amplifier 506 by enabling shift right transistor 521-3. Similarly, a data value present on the Read digit_n digit line 505-2 can be loaded into the middle sense amplifier 506 and shifted from the middle sense amplifier 506 to the left sense amplifier 506 by enabling shift left transistor 521-1. Accordingly, data values latched by the sense amplifiers 506 illustrated in FIG. 5 may be shifted to the left or right from one sense amplifier to another by enabling the shift left and shift right transistors, which connect an output of one sense amplifier 506 to the input of an adjacent sense amplifier 506, as shown in FIG. 5.

Figure 6:
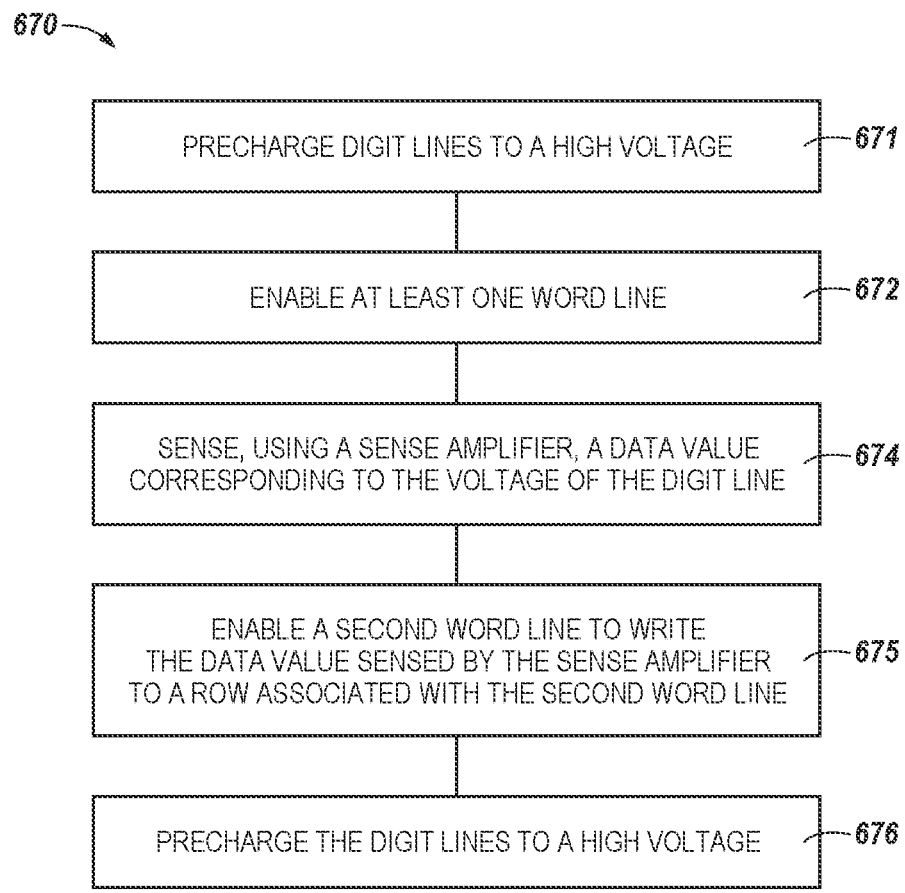
FIG. 6 is a flow diagram for performing logical operations using memory cells in accordance with a number of embodiments of the present disclosure.

FIG. 6 is a flow diagram 670 for performing logical operations using memory cells in accordance with a number of embodiments of the present disclosure. At block 671, a digit line may be precharged to a first voltage (e.g., a high voltage corresponding to a logical value of "1"). The digit line may be one or more of the digit lines 205 illustrated in FIG. 2, for example. In some embodiments, the digit line that is precharged to the first voltage may be a read digit line.

At block 672, at least one word line of a memory array may be enabled (e.g., activated). The at least one word line may correspond to one or more of the word lines 209 illustrated in FIG. 2, for example. The enabled word line may be a read row word line. As discussed above, each word line that is enabled can correspond a quantity of inputs (e.g., K inputs, where K is a non-zero integer) of a logical operation such as a NOR logical operation. Accordingly, the NOR logical operation may be a K-input NOR logical NOR operation. For example, if two word lines are enabled, a 2-input NOR operation results, if three word lines are enabled, a 3-input NOR operations results, etc. In some embodiments, each one of the K memory cells may store a data value corresponding to a respective one of the K-inputs. Further, as described above, each digit line enabled may correspond to a number (N) of NOR gates that each have K inputs corresponding the number (K) of word lines enabled associated therewith.

In some embodiments, a read word line can be activated. The read word line may be a read word line corresponding to the K memory cells. While at least one of the read word lines corresponding to the K memory cells is activated, a sense amplifier coupled to the read digit line can be enabled. In some embodiments, subsequent to enabling the sense amplifier, a result of the K-input logical operation resides in the sense amplifier. The read word lines corresponding to the K memory cells may be activated simultaneously, or they may be activated at different times.

The sense amplifier may be configured to sense a particular logic value responsive to one or more of the K memory cells storing a first data value and sense a different logic value responsive to all of the K memory cells storing a second data value that is different than the first data value.

At block 674, a data value corresponding to the voltage of the digit line may be sensed by a sense amplifier coupled to the digit line. In some embodiments, if one more memory cells coupled to the digit line contains a first voltage (e.g., a logical value of "1"), the sense amplifier senses a second voltage (e.g., a low voltage corresponding to a logical value of "0"). Conversely, if one more memory cells coupled to the digit line contains the second voltage (e.g., a logical value of "0"), the sense amplifier senses the first voltage (e.g., a logical value of "1").

As discussed above, a read operation may be non-destructive such that the original data value stored in the memory cell (e.g., the data value stored in the memory cell prior to performance of the logical operation) is still stored in the memory cell after performance of the logical operation. In some embodiments, the result of the logical operation may be stored in a sense amplifier coupled to the memory cell.

At block 675, a word line may be enabled to write the data value sensed by the sense amplifier to a row of the memory array associated with the word line. In some embodiments, the word line that is enabled to write the data value sensed by the sense amplifier to the memory array may be a write row word line. In some embodiments, the word line may be enabled to write the data value sensed by the sense amplifier to a row of the memory array while at least digit line (e.g., a row line) is enabled. This may allow for data to be written and read concurrently.

Finally, at block 676, the digit lines may be precharged to a first voltage again in anticipation of performing another logical operation.

Operations to perform a logical NOR operation in accordance with the disclosure can be summarized as follows:

Enable Precharge1 to precharge one or more read digit lines (e.g., digit lines 305-2 illustrated in FIG. 3) to $V_{cc}$ (e.g., to a high voltage)

Enable Precharge2 to precharge sense amplifier (e.g., digit lines 317-1 and 317-2 illustrated in FIG. 3) to $V_{cc}$ (e.g., to a high voltage)

Disable Precharge1

Disable Precharge2

Enable one or more read row lines

Fire sense amplifier (e.g., toggle RNL illustrated in FIG. 3 from a low voltage to a high voltage)

Sense amplifier (e.g., sense amplifier 306 illustrated in FIG. 3) senses a low voltage (e.g., a logic value of "0") if one or more cells on a read digit line contains a high voltage (e.g., a logic value of "1")

Sense amplifier senses a high voltage (e.g., a logic value of "1") if all cells on a read digit line contain a low voltage (e.g., a logic value of "0")

Disable read row lines

Enable one or more write row lines to write the value sensed by the sense amplifier to that row Disable write row lines Disable sense amplifier (e.g., toggle RNL illustrated in FIG. 3 from a high voltage to a low voltage)

Enable Precharge1 to precharge one or more read digit lines to $V_{cc}$ in preparation for a subsequent read and/or logical operation Enable Precharge2 to precharge sense amplifier to $V_{cc}$ in preparation for a subsequent read and/or logical operation As described above in more detail, the read is non-destructive so the memory cells contain their original data. Accordingly, in some embodiments, only the sense amplifier contains the result of the NOR operation.

Operations to write the data value sensed by the sense amplifier to the memory array can be summarized as follows:

Enable one or more write row lines to write the value sensed by the sense amplifier Enable write true transistor (e.g., WRITE TRUE transistor 313-1 illustrated in FIG. 3) to write the data value stored in the sense amplifier to a memory cell array Enable write comp transistor (e.g., WRITE COMP transistor 313-2 illustrated in FIG. 3) to write the complement of the data value stored in the sense amplifier to a memory cell of the array Disable write row lines Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    operating a first memory cell to invert a data value stored therein corresponding to a first operand for a logical operation, wherein the data value corresponding to the first operand is inverted without transferring the data value to a latch outside of a sense amplifier latch; and
    performing the logical operation between the inverted data value stored in the first memory cell and a data value corresponding to a second operand stored in a storage location associated with a memory device; and
    enabling a first transistor associated with the storage location to write a result of the logical operation to the first memory cell and enabling a second transistor associated with the storage location to write a complement of the logical operation to a second memory cell of the memory device.

2. The method of claim 1, further comprising preserving the data value corresponding to the first operand subsequent to performing the logical operation.

3. The method of claim 1, wherein the storage location comprises a third memory cell associated with the memory device.

4. The method of claim 1, wherein the storage location comprises a sense amplifier associated with the memory device.

5. The method of claim 1, further comprising shifting a result of the logical operation from a first sense amplifier associated with the memory device to a second sense amplifier associated with the memory device.

6. The method of claim 1, further comprising transferring the complement of a result of the logical operation to at least one of a third memory cell associated with the memory device or a sense amplifier associated with the memory device.

7. The method of claim 1, further comprising storing a result of the logical operation in a sense amplifier coupled to the first memory cell.

8. A method, comprising:
performing a logical operation by:
charging, to a first voltage, a read digit line coupled to a plurality of memory cells associated with a memory device, wherein each one of the memory cells of the plurality of memory cells stores a data value corresponding to a respective input of the logical operation;
activating, after charging the read digit line, a plurality of read word lines corresponding to the plurality of memory cells;
enabling a sense amplifier coupled to the read digit line; and
sensing, via the sense amplifier, a result of the logical operation, wherein:
the result of the logical operation is a logic 0 value responsive to the read digit having a second voltage that is less than the first voltage after activating the plurality of read word lines, wherein the read digit line transitions from the first voltage to the second voltage based on at least one of the plurality of memory cells storing a first data value corresponding to a logic 1 value; or
the result of the logical operation is the logic 1 value responsive to the read digit line having the first voltage after activating the plurality of read word lines, wherein the read digit line maintains the first voltage based on all of the plurality of memory cells storing a second data value corresponding to the logic 0 value; and
writing the result of the logical operation or a complement of the result of the logical operation to memory cells coupled to a write digit line of the memory device based on enabling a first transistor coupled to the sense amplifier or enabling a second transistor coupled to the sense amplifier.

9. The method of claim 8, wherein, subsequent to enabling the sense amplifier, the result of the logical operation resides in the sense amplifier.

10. The method of claim 8, wherein the plurality of memory cells are nondestructive read memory cells such that the activating the plurality of read word lines and enabling the sense amplifier does not destroy the data values stored in the plurality of memory cells.

11. The method of claim 8, wherein the logical operation is a logical NOR operation having a quantity, K, inputs.

12. An apparatus, comprising:
an array of memory cells; and
a controller coupled to the array of memory cells, wherein the controller is configured to cause performance of a multi-input logical operation by:
charging, to a first voltage, a read digit line coupled to a plurality of memory cells, wherein each one of the plurality of memory cells stores a data value corresponding to a respective one of the inputs;
activating, after charging the read digit line, a plurality of read word lines corresponding to the plurality of memory cells;
enabling a sense amplifier coupled to the read digit line; and
controlling the sense amplifier to sense a result of the logical operation, wherein:
the result of the logical operation is a logic 0 value responsive to the read digit having a second voltage that is less than the first voltage after activating the plurality of read word lines, wherein the read digit line transitions from the first voltage to the second voltage based on at least one of the plurality of memory cells storing a first data value corresponding to a logic 1 value; or
the result of the logical operation is the logic 1 value responsive to the read digit line having the first voltage after activating the plurality of read word lines, wherein the read digit line maintains the first voltage based on all of the plurality of memory cells storing a second data value corresponding to the logic 0 value;
and
enable a first transistor coupled to the sense amplifier to write the result of the multi-input logical operation to memory cells coupled to a first write row line and enable a second transistor coupled to the sense amplifier to write a complement of the result of the multi-input logical operation to memory cells coupled to a second write row line.

13. The apparatus of claim 12, wherein the controller is configured to cause the plurality of read word lines corresponding to the plurality of memory cells to be activated simultaneously.

14. The apparatus of claim 12, wherein the controller is configured to cause the plurality of read word lines corresponding to the plurality of memory cells to be activated at different times.

15. The apparatus of claim 12, wherein the plurality of memory cells are three transistor (3T) dynamic random-access memory (3T DRAM) cells.

16. The apparatus of claim 12, wherein the plurality of memory cells are nondestructive read memory cells such that activating the plurality of read word lines and enabling the sense amplifier does not overwrite data values stored in the plurality of memory cells.

17. The apparatus of claim 12, wherein the multi-input logical operation is a multi-input logical NOR operation.

18. The apparatus of claim 12, wherein the controller is configured to cause the result of the multi-input logical operation to be shifted from the sense amplifier to a different sense amplifier.

19. The apparatus of claim 12, wherein the sense amplifier is a sense amplifier among a plurality of sense amplifiers coupled to respective memory cells among the plurality of memory cells.

* * * * *

UNITED STATES PATENT AND TRADEMARK OFFICE
CERTIFICATE OF CORRECTION

Page 1 of 2

PATENT NO. : 12,183,387 B2
APPLICATION NO. : 17/859992
DATED : December 31, 2024
INVENTOR(S) : Manning et al.

It is certified that error appears in the above-identified patent and that said Letters Patent is hereby corrected as shown below:

In the Claims

Column 15, Lines 4-7 Claim 5 should read:
"The method of claim 1, further comprising shifting the result of the logical operation from a first sense amplifier associated with the memory device to a second sense amplifier associated with the memory device."

Column 15, Lines 8-12 Claim 6 should read:
"The method of claim 1, further comprising transferring the complement of the result of the logical operation to at least one of a third memory cell associated with the memory device or a sense amplifier associated with the memory device."

Column 15, Lines 13-16 Claim 7 should read:
"The method of claim 1, further comprising storing the result of the logical operation in a sense amplifier coupled to the first memory cell."

Column 15, Line 62-Column 16, Line 36 Claim 12 should read:
"An apparatus, comprising:
an array of memory cells; and
a controller coupled to the array of memory cells, wherein the controller is configured to cause performance of a multi-input logical operation by:
charging, to a first voltage, a read digit line coupled to a plurality of memory cells, wherein each one of the plurality of memory cells stores a data value corresponding to a respective input of the logical operation;
activating, after charging the read digit line, a plurality of read word lines corresponding to the plurality of memory cells;
enabling a sense amplifier coupled to the read digit line; and
controlling the sense amplifier to sense a result of the logical operation, wherein:
the result of the logical operation is a logic 0 value responsive to the read digit having a second voltage that is less than the first voltage after activating the plurality of read word lines, wherein the Signed and Sealed this
Twenty-third Day of September, 2025

John A. Squires
*Director of the United States Patent and Trademark Office* read digit line transitions from the first voltage to the second voltage based on at least one of the plurality of memory cells storing a first data value corresponding to a logic 1 value; or
the result of the logical operation is the logic 1 value responsive to the read digit line having the first voltage after activating the plurality of read word lines, wherein the read digit line maintains the first voltage based on all of the plurality of memory cells storing a second data value corresponding to the logic 0 value; and
enable a first transistor coupled to the sense amplifier to write the result of the multi-input logical operation to memory cells coupled to a first write row line and enable a second transistor coupled to the sense amplifier to write a complement of the result of the multi-input logical operation to memory cells coupled to a second write row line."